United States Patent
Shang et al.

(10) Patent No.: US 10,096,374 B2
(45) Date of Patent: Oct. 9, 2018

(54) SHIFT REGISTER CIRCUIT, ARRAY SUBSTRATE AND DISPLAY DEVICE

(71) Applicant: BOE TECHNOLOGY GROUP CO., LTD., Beijing (CN)

(72) Inventors: Guangliang Shang, Beijing (CN); Seungwoo Han, Beijing (CN); Haoliang Zheng, Beijing (CN); Xing Yao, Beijing (CN); Mingfu Han, Beijing (CN); Hyunsic Choi, Beijing (CN); Yunsik Im, Beijing (CN); Yinglong Huang, Beijing (CN); Jungmok Jun, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/539,220

(22) PCT Filed: Nov. 1, 2016

(86) PCT No.: PCT/CN2016/104226
§ 371 (c)(1),
(2) Date: Jun. 23, 2017

(87) PCT Pub. No.: WO2017/128795
PCT Pub. Date: Aug. 3, 2017

(65) Prior Publication Data
US 2018/0047329 A1 Feb. 15, 2018

(30) Foreign Application Priority Data

Jan. 25, 2016 (CN) .......................... 2016 1 0046275

(51) Int. Cl.
*G09G 3/36* (2006.01)
*G11C 19/28* (2006.01)
*G09G 3/20* (2006.01)

(52) U.S. Cl.
CPC ......... *G11C 19/287* (2013.01); *G09G 3/2096* (2013.01); *G09G 3/3666* (2013.01);
(Continued)

(58) Field of Classification Search
CPC .. G09G 3/2096; G09G 3/3266; G09G 3/3666; G09G 3/3674; G09G 3/3677;
(Continued)

(56) References Cited

U.S. PATENT DOCUMENTS 8,462,098 B2 * 6/2013 Tobita ................. G09G 3/3677
345/100
8,508,458 B2 * 8/2013 Han ..................... G09G 3/3677
345/100

(Continued)

FOREIGN PATENT DOCUMENTS

CN 1637556 A 7/2005
CN 1746966 A 3/2006

(Continued)

OTHER PUBLICATIONS

Search Report for International Patent Application No. PCT/CN2016/104226 dated Feb. 4, 2017.

(Continued)

*Primary Examiner* — Patrick O'Neill
(74) *Attorney, Agent, or Firm* — Calfee, Halter & Griswold LLP

(57) ABSTRACT

The present disclosure provides a shift register circuit, an array substrate, and a display device. For a first driver and a second driver adjacent to each other in a direction substantially perpendicular to the gate line, a first driving input (Continued)

wiring of the first driver is arranged to input a first clock driving signal to individual shift registers successively from a shift register at a first end position of the first driver to a shift register at a second end position of the first driver, and a second driving input wiring of the second driver is arranged to input a second clock driving signal to individual shift registers successively from a shift register at a second end position of the second driver to a shift register at a first end position of the second driver.

20 Claims, 9 Drawing Sheets

(52) U.S. Cl.
CPC ... *G09G 3/3677* (2013.01); *G09G 2300/0408* (2013.01); *G09G 2310/0286* (2013.01); *G09G 2320/0223* (2013.01)

(58) Field of Classification Search
CPC ... G09G 2300/0408; G09G 2310/0286; G09G 2320/0223; G11C 19/28; G11C 19/287
See application file for complete search history.

(56) References Cited

U.S. PATENT DOCUMENTS

| | | |
|---|---|---|
| 2005/0248556 A1 | 11/2005 | Yoshinaga et al. |
| 2009/0122047 A1 | 5/2009 | Yamamoto et al. |
| 2010/0171689 A1 | 7/2010 | Jeong |
| 2015/0049272 A1 | 2/2015 | Oki |
| 2015/0138466 A1 | 5/2015 | Mori |
| 2016/0365042 A1* | 12/2016 | Zheng ...................... G09G 3/36 |
| 2017/0124972 A1* | 5/2017 | Kim ..................... G09G 3/3648 |

FOREIGN PATENT DOCUMENTS

| | | |
|---|---|---|
| CN | 101436382 A | 5/2009 |
| CN | 103293799 A | 9/2013 |
| CN | 104285177 A | 1/2015 |
| CN | 104680990 A | 6/2015 |
| CN | 105609074 A | 5/2016 |

OTHER PUBLICATIONS

First Office Action for Chinese Patent Application No. 201610046275.8 dated Aug. 3, 2017.
Second Office Action for Chinese Patent Application No. 201610046275.8 dated Mar. 6, 2018.

* cited by examiner

SHIFT REGISTER CIRCUIT, ARRAY SUBSTRATE AND DISPLAY DEVICE

RELATED APPLICATION

The present application is the U.S. national phase entry of PCT/CN2016/104226, with an international filing date of Nov. 1, 2016, which claims the benefit of Chinese Patent Application No. 201610046275.8, filed on Jan. 25, 2016, the entire disclosure of which is incorporated herein by reference.

FIELD

The present disclosure pertains to the field of display driving technology, and relates to block driving of a gate driver on array (GOA), and particularly to a shift register circuit, an array substrate and a display device.

BACKGROUND

In a display panel, a gate driving circuit needs to be used to drive a TFT array formed on an array substrate so as to control display of pixel or sub-pixel units. GOA technique is a technique in which a gate driving circuit is fabricated on an array substrate, which avoids arrangement of a circuit board and a chip for forming the gate driving circuit outside the array substrate, and is hence very advantageous to reducing the size of the display's frame, improving the integration level of the display panel and decreasing the cost. Therefore, the GOA technique is widely used.

SUMMARY

It is an objective of the present disclosure to provide an improved shift register circuit, array substrate, and display device.

According to an aspect of the present disclosure, there is provided a shift register circuit comprising two or more drivers arranged on an array substrate in a direction substantially perpendicular to a gate line, each driver comprising one or more shift registers, wherein any two of the drivers adjacent to each other are defined as a first driver and a second driver, respectively.

A first driving input wiring of the first driver is arranged to input a first clock driving signal to individual shift registers successively from a shift register at a first end position of the first driver to a shift register at a second end position of the first driver, and a second driving input wiring of the second driver is arranged to input a second clock driving signal to individual shift registers successively from a shift register at a second end position of the second driver to a shift register at a first end position of the second driver. In each of the drivers, the second end position is opposite to the first end position in the direction substantially perpendicular to the gate line.

According to some embodiments, the shift register circuit further comprises a first input compensation resistor arranged corresponding to the first driving input wiring, and a second input compensation resistor arranged corresponding to the second driving input wiring, wherein a sum of resistances of the first driving input wiring and the first input compensation resistor is equal to a sum of resistances of the second driving input wiring and the second input compensation resistor.

According to some embodiments, the first input compensation resistor and/or the second input compensation resistor are arranged on the array substrate and/or outside the array substrate.

According to some embodiments, the first end position corresponds to a minimum permutation ordinal number of gate lines to which the first driver or the second driver corresponds on the array substrate, and the second end position corresponds to a maximum permutation ordinal number of gate lines to which the first driver or the second driver corresponds on the array substrate.

According to some embodiments, the first driving input wiring extends in the direction substantially perpendicular to the gate line and is arranged close to the first driver, and the second driving input wiring comprises a first segment arranged in the direction substantially perpendicular to the gate line and a second segment which is reversely bent with respect to the first segment and connected thereto, the second segment being arranged closer to the second driver than the first segment.

According to some embodiments, the first driving input wiring comprises a first segment arranged in the direction substantially perpendicular to the gate line and a second segment which is vertically bent with respect to the first segment and connected thereto, and the second driving input wiring comprises a first segment arranged in the direction substantially perpendicular to the gate line and a second segment which is reversely bent with respect to the first segment and connected thereto, the second segment being arranged closer to the second driver than the first segment.

According to some embodiments, the second segment of the first driving input wiring is arranged closer to the first driver than the first segment of the first driving input wiring.

According to some embodiments, the first end position corresponds to a maximum permutation ordinal number of gate lines to which the first driver or the second driver corresponds on the array substrate, and the second end position corresponds to a minimum permutation ordinal number of gate lines to which the first driver or the second driver corresponds on the array substrate.

According to some embodiments, the first driving input wiring comprises a first segment arranged in the direction substantially perpendicular to the gate line and a second segment which is reversely bent with respect to the first segment and connected thereto, the second segment of the first driving input wiring being arranged closer to the first driver than the first segment, and the second driving input wiring comprises a first segment arranged in the direction substantially perpendicular to the gate line and a second segment which is vertically bent with respect to the first segment and connected thereto.

According to some embodiments, the second segment of the second driving input wiring is arranged closer to the second driver than the first segment of the second driving input wiring.

In the shift register circuit described in any of the above embodiments, further, the first driving input wiring and the second driving input wiring input the first clock driving signal and the second clock driving signal respectively at a same position of the array substrate.

In the shift register circuit described in any of the above embodiments, further, the first driving input wiring and the second driving input wiring have a substantially same line width and/or line thickness.

In the shift register circuit according any of the above embodiments, further, each of the drivers includes a same number of shift registers.

According to another aspect of the present disclosure, there is provided an array substrate comprising the shift register circuit described in any of the above embodiments.

According to a further aspect of the present disclosure, there is provided a display device comprising the array substrate described above.

In the above embodiments of the present disclosure, by arranging the first driving input wiring and the second driving input wiring which input the clock driving signals in reverse directions respectively for the first driver and the second driver adjacent to each other, RC delay at the boundary of any two adjacent drivers would not undergo a transition or the transition is greatly reduced. The display device using such shift register would not involve the problem of generating blocks in display, which is advantageous to reducing flickers, stripes and mura, leading to a significantly improved display effect.

BRIEF DESCRIPTION OF DRAWINGS

The above and other objectives and advantages of the present disclosure will become more comprehensive and apparent from the following detailed description with reference to the accompanying drawings in which the same or similar elements are denoted by identical reference numerals.

DETAILED DESCRIPTION

Figure 1:
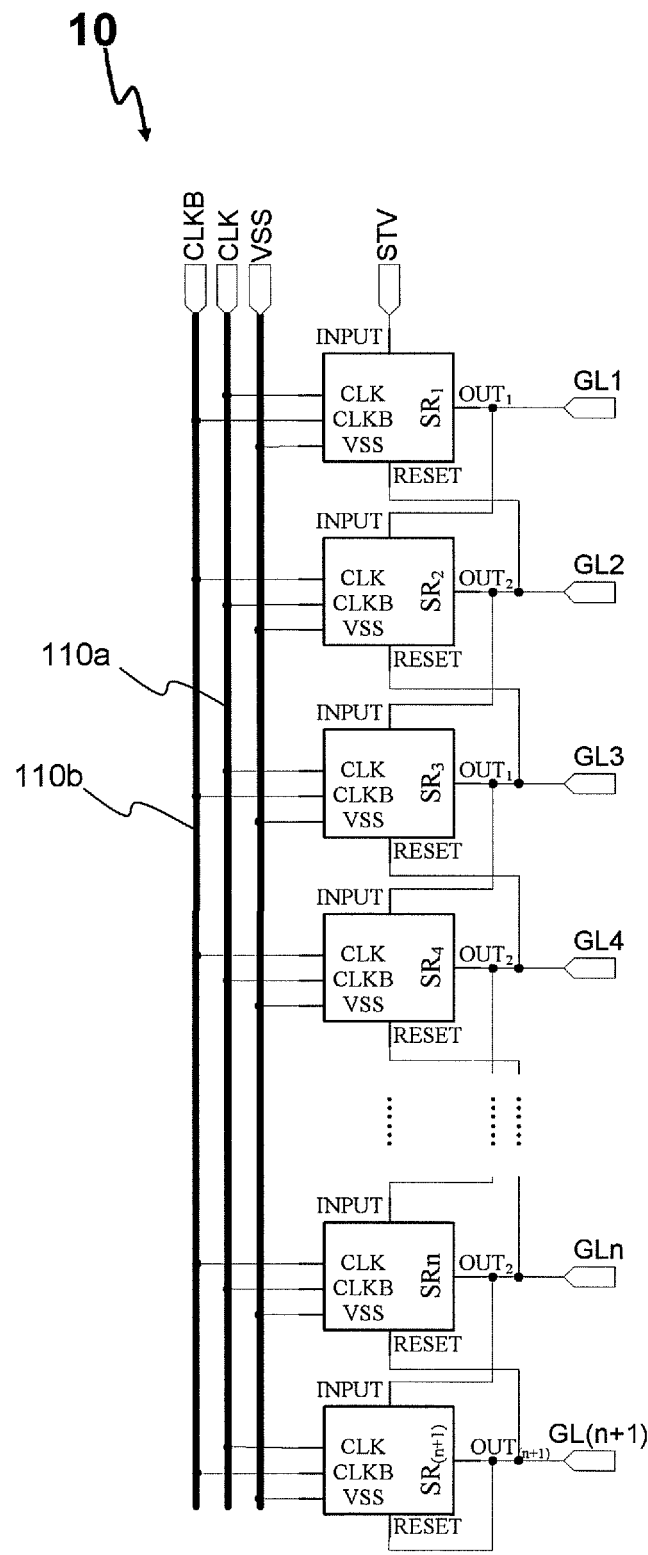
FIG. 1 is a schematic view of a basic structure of a conventional shift register circuit.

Some of multiple possible embodiments of the present disclosure are introduced below, which are intended to provide a basic understanding of the present disclosure rather than to identify key or determinative elements of the present disclosure or to define a range to be protected. It will be readily understood that other embodiments may be put forward by those ordinarily skilled in the art based on the technical solution of the present disclosure without departing from the spirit of the present disclosure. Accordingly, the following specific embodiments and the accompanying drawings only illustrate the technical solution of the present disclosure and should not be construed as a comprehensive disclosure or as limitation or restriction to the technical solution of the present disclosure.

In the description below, to make the description clear and concise, detailed description is not made to all the multiple components shown in the drawings. The drawings show multiple components that enable those ordinarily skilled in the art to carry out the present disclosure. For those skilled in the art, the operations of many components are familiar and apparent.

In the following embodiments of the present disclosure, the array substrate is provided with a plurality of parallel gate lines and a plurality of data lines substantially perpendicular to the gate lines. The direction of the gate lines (i.e. the direction in which the gate lines reside) is defined as the direction of "row", i.e. the X direction shown in the drawings, and the direction perpendicular to the gate line is defined as the direction of "column", i.e. the direction of the data lines (i.e. the direction in which the data lines are arranged on the array substrate), i.e. the Y direction shown in the drawings. It is to be understood that, in other alternative embodiments, for example, the direction of the gate lines may also be defined as the direction of "column", and the direction of the data lines is defined as the direction of "row".

In current GOA techniques, a shift register arranged on an array substrate is used to provide a gate driving signal for a respective gate line. The shift register may also be referred to as a GOA unit. FIG. 1 is a schematic view showing a basic structure of a conventional shift register circuit. As shown in FIG. 1, a shift register circuit 10 comprises shift registers $SR_1, SR_2, \ldots, SR_n, SR_{(n+1)}$ arranged on an array substrate which are corresponding to gate lines $GL_1, GL_2, \ldots, GL_n, GL_{(n+1)}$, respectively. An output signal OUT (i.e. $OUT_1$, $OUT_2, \ldots$ or $OUT_{(n+1)}$ of each shift register is further inputted as an input signal INPUT to a shift register to which a gate line of the next row corresponds; meanwhile, the output signal OUT of the shift register of the next row is further inputted to a shift register of the previous row as a reset signal RESET. Clock driving signals CLK and CLKB inputted to the shift registers $SR_1, SR_2, \ldots, SR_n, SR_{(n+1)}$ come from the same signal source, i.e. CLK and CLKB, which access driving signal input terminals of each shift register, i.e. CLK and CLKB in the shift register, respectively via the same driving input wirings 110a and 110b arranged on the array substrate.

Figure 2:
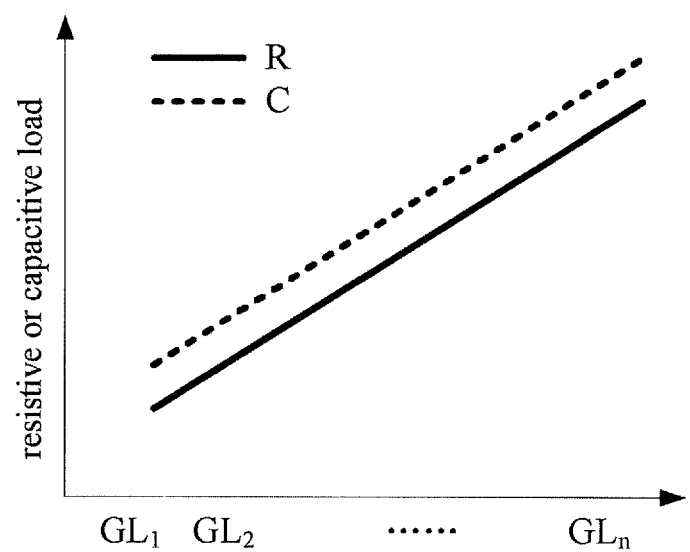
FIG. 2 is a schematic view showing variation tendencies of resistive loads and capacitive loads inputted by driving signals of respective shift registers in the shift register circuit of the embodiment shown in FIG. 1.

In the shift register circuit shown in FIG. 1, since all the shift registers are inputted with the same clock driving signal, and for each shift register, an input resistive load and an input capacitive load of a driving signal thereof are substantially continuously changed relative to an input resistive load and an input capacitive load of a driving signal of a shift register of an adjacent previous row, the variation tendencies of the resistive loads and the capacitive loads inputted by the driving signals of respective shift registers in the shift register circuit can be as shown in FIG. 2. In FIG. 2, the abscissa represents the shift registers to which the gate lines $GL_1, GL_2, \ldots, GL_n$ correspond, respectively, and the ordinate represents the resistive loads and the capacitive loads corresponding to the driving signals at the above shift registers. It can be seen that the resistive loads and the capacitive loads of the driving signals between the shift registers arranged adjacent to each other are substantially continuously changed, so that there is no mura upon display.

In order to reduce the power consumption of the shift register circuit 10 as shown in FIG. 1, more and more shift register circuits are subjected to block driving, that is, a plurality of shift registers to which several rows correspond are divided into one block or region, which is defined as a driver or a GOA block. Between two adjacent GOA blocks, different GOA blocks use different clock driving signals such that they operate at different times, respectively, thereby reducing the capacitive load of charging and discharging of the clock driving signal and reducing the power consumption.

However, the inventors of the present application have found that, at the boundary of adjacent GOA blocks, the resistive loads and the capacitive loads inputted by the driving signals of the shift registers arranged adjacent to each other will undergo a relatively large transition, thereby generating a delay transition of the driving signal input correspondingly. The delay transition results in the problem of generating blocks in display, for example, the phenomenon of flickers, stripes and mura occurs between display areas to which adjacent GOA blocks correspond.

Figure 3:
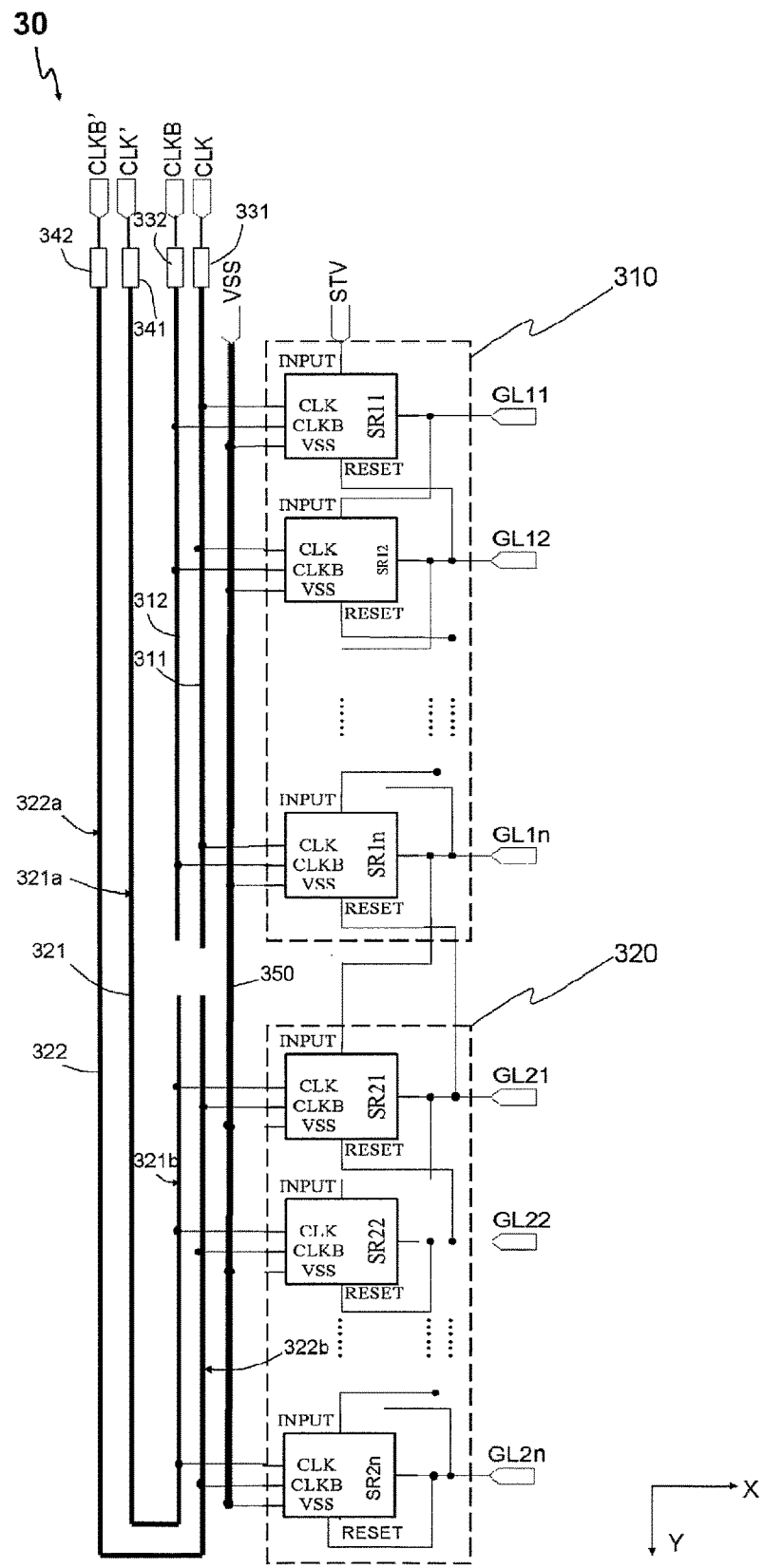
FIG. 3 is a schematic view of a basic structure of a shift register circuit according to an embodiment of the present disclosure.
Figure 4:
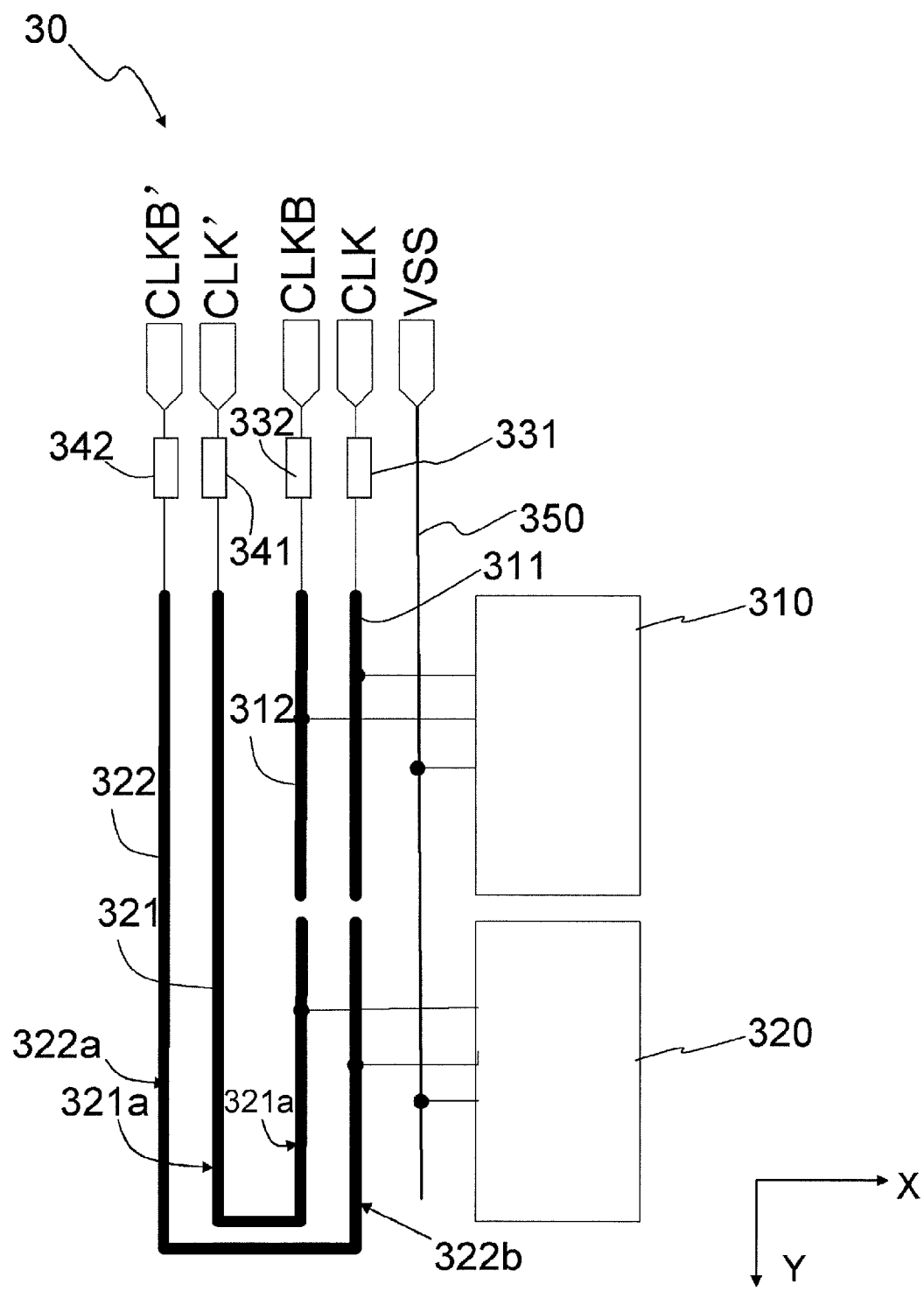
FIG. 4 is a simplified schematic view of the structure of the shift register circuit of the embodiment shown in FIG. 3.

In this regard, the present disclosure provides an improved shift register circuit. FIG. 3 is a schematic view of a basic structure of a shift register circuit according to an embodiment of the present disclosure, and FIG. 4 is a simplified schematic view of the structure of the shift register circuit of the embodiment shown in FIG. 3. With reference to FIGS. 3 and 4, there is shown a partial circuit configuration of a shift register circuit 30 arranged on an array substrate (not shown). The shift register circuit 30 is mainly used to provide driving signal outputs for a plurality of gate lines so that gate driving signals can be applied to the gate lines. In this embodiment, input terminals of several of the gate lines arranged on the array substrate are illustrated, which are specifically gate lines $GL_{11}$, $GL_{12}$, ..., $GL_{1n}$, and gate lines $GL_{21}$, $GL_{22}$, ..., $GL_{2n}$, respectively, wherein the gate lines $GL_{11}$, $GL_{12}$, ..., $GL_{1n}$ and gate lines $GL_{21}$, $GL_{22}$, ..., $GL_{2n}$ are arranged in parallel successively in the Y direction. Shift registers $SR_{11}$, $SR_{12}$, ..., $SR_{1n}$ are arranged corresponding to the gate lines $GL_{11}$, $GL_{12}$, ..., $GL_{1n}$, respectively, and shift registers $SR_{21}$, $SR_{22}$, ..., $SR_{2n}$ are arranged corresponding to the gate lines $GL_{21}$, $GL_{22}$, ..., $GL_{2n}$, respectively. It is to be understood that an output terminal of each shift register SR is directly connected to the gate line and provides a gate driving signal for the gate line, i.e. outputting the driving signal output of the shift register circuit 30. Each shift register SR may also be referred to as "GOA unit".

In embodiments of the present disclosure, the shift register circuit 30 needs to be inputted with at least a clock driving signal to drive each of the shift registers SR therein. In terms of the inputted clock driving signals, the shift registers of the shift register circuit 30 on the array substrate may be divided into different drivers. In the embodiment shown in FIG. 3, the shift registers $SR_{11}$, $SR_{12}$, ..., $SR_{1n}$ are inputted with clock driving signals CLK and CLKB, and constitute a driver 310, and the shift registers $SR_{21}$, $SR_{22}$, ..., $SR_{2n}$ are inputted with clock driving signal CLK' and CLKB', and constitute a driver 320. The driver 310 and the driver 320 are divided in the Y direction, which are inputted with different clock driving signals respectively, thereby realizing block driving.

It is to be understood that the division of drivers is carried out based on the difference between the inputted clock driving signals. The dashed blocks shown in FIG. 3 are only used to clearly illustrate the area ranges of the drivers. Each driver is arranged to be provided on the array substrate as a whole, thus it may also be referred to as a "GOA block". These drivers are driven by different clock signals and operate at different times, respectively, which is advantageous to reducing the capacitive load of charging and discharging of the clock driving signal. Therefore, utilizing block driving can reduce the overall power consumption of the shift register circuit 30.

Continuing to refer to FIG. 3, in multiple adjacent drivers, the output signal of each shift register SR is further inputted as an input signal INPUT to a shift register SR to which a gate line of the next row corresponds. At the same time, an output signal of a shift register SR of the next row is further inputted to a shift register SR of the previous row as a reset signal RESET. All the drivers can be simultaneously inputted with a voltage signal VSS, i.e. all the shift registers SR are inputted with the voltage signal VSS via a driving input wiring 350.

Continuing to refer to FIG. 3 and FIG. 4, different driving input wirings are arranged corresponding to the different drivers, respectively. Specifically, driving input wirings 311 and 312 are arranged corresponding to the driver 310, wherein the driving input wiring 311 is used to input the clock driving signal CLK, and the driving input wiring 312 is used to input the clock driving signal CLKB. Driving input wirings 321 and 322 are arranged corresponding to the driver 320, wherein the driving input wiring 321 is used to input the clock driving signal CLK', and the driving input wiring 322 is used to input the clock driving signal CLKB'.

Continuing to refer to FIG. 3 and FIG. 4, the driver 310 and the driver 320 are arranged adjacent to each other in the Y direction. That is, the gate line of the last row to which the driver 310 corresponds in the Y direction is adjacent to the gate line of the first row to which the driver 320 corresponds in the Y direction, i.e. the gate line $GL_{1n}$ and the gate line $GL_{21}$ are adjacent rows, which represent the boundary of the driver 310 and the driver 320. In embodiments of the present disclosure, the first numeral of the subscript of the gate line GL or the shift register SR reflects the driver to which it belongs, and the second numeral of the subscript thereof reflects a corresponding permutation ordinal number thereof (e.g. row number) in the driver to which it belongs.

For each driver, a first end position and a second end position can be defined. The second end position is opposite to the first end position in the direction (Y direction) perpendicular to the gate line, i.e. they are arranged opposite to each other in the Y direction. In the embodiment shown in FIG. 3, an input terminal position of the clock driving signal of the shift register $SR_{11}$ to which the gate line $GL_{11}$ of the driver 310 corresponds may be defined as the first end position, and the input terminal position of the clock driving signal of the shift register $SR_{1n}$ to which the gate line $GL_{1n}$ of the driver 310 corresponds may be defined as the second end position. Accordingly, the driving input wirings 311 and 312 extend in the Y direction and are arranged to input the clock driving signals CLK and CLKB to individual shift registers from the shift register $SR_{11}$ at the first end position of the driver 310 to the shift register $SR_{1n}$ at the second position of the driver 310 successively. This reflects the direction along which the clock driving signals of the driver 310 are inputted. An input terminal position of the clock driving signal of the shift register $SR_{21}$ to which the gate line $GL_{21}$ of the driver 320 corresponds may be defined as the first end position, and an input terminal position of the clock driving signal of the shift register $SR_{2n}$ to which the gate line $GL_{2n}$ of the driver 320 corresponds may be defined as the second end position. Accordingly, the driving input wirings 321 and 322 are arranged to input the clock driving signals CLK' and CLKB' to individual shift registers from the shift register $SR_{2n}$ at the second end position of the driver 320 to the shift register $SR_{21}$ at the first end position of the driver 320 successively. This reflects the direction along which the clock driving signals of the driver 320 are inputted.

The second end position of the driver 310 and the first end position of the driver 320 may also be defined as "adjacent ends" in terms of the relative position between adjacent drivers, and the positions away from the adjacent ends in the Y direction are defined as "distal ends", i.e. the first end position of the driver 310 is the distal end thereof, and the second end position of the driver 320 is the distal end thereof. For the driver 310, the clock driving signals CLK and CLKB are inputted to the shift registers SR from the distal end to the adjacent end successively. For the driver 320, the clock driving signals CLK' and CLKB' are inputted to the shift registers SR from the distal end to the adjacent end successively. However, it is to be understood that, "adjacent end" and "distal end" are just relative definitions and clarifications. For example, a distal end of the driver 320 may also be referred to as an "adjacent end" with respect to a driver (not shown) arranged adjacently below the driver 320.

Continuing to refer to FIG. 3 and FIG. 4, the driving input wirings 311 and 312 may be arranged in parallel on the array substrate in the Y direction and arranged close to one side of the driver 310. For the driving input wirings 321 and 322, they may be, but not limited to, arranged on the array substrate in a bent manner so as to input the clock driving signals CLK' and CLKB' to individual shift registers from the shift register $SR_{2n}$ at the second end position thereof to the shift register $SR_{21}$ at the first position thereof successively.

In this embodiment, the driving input wirings 311 and 312 and the driving input wirings 321 and 322 access corresponding clock driving signals from the same position of the array substrate, respectively. Specifically, the input terminals of the clock driving signals CLK and CLKB, CLK' and CLKB' on the array substrate are arranged at substantially the upper end positions of the starting rows of the gate lines. In this way, the driving input wirings 311 and 312 are arranged on the array substrate in the Y direction from top to bottom, and a first segment 321a/322a of the driving input wiring 321/322 is arranged in the Y direction from top to bottom and a second segment 321b/322b thereof is arranged in the Y direction from bottom to top after reversely bent. That is, the first segment 321a/322a of the driving input wiring 321/322 is arranged in the Y direction, the second segment 321b/322b is also arranged in the Y direction but is relatively close to the driver 320, and the second segment 321b/322b is reversely bent with respect to the first segment 321a/322a and connected thereto.

In this embodiment, the driving input wirings 311 and 312, and the driving input wirings 321 and 322 may be formed of an electrically conductive material, for example, a metal wiring. The driving input wirings 311 and 312 and the driving input wirings 321 and 322 may have the same line width and/or line thickness, so that they can be manufactured in an easier manner.

Continuing to refer to FIG. 3 and FIG. 4, optionally, an input compensation resistor may be arranged corresponding to each of the driving input wirings. In this embodiment, input compensation resistors 331 and 332 are arranged corresponding to the driving input wirings 311 and 312, respectively, and input compensation resistors 341 and 342 are arranged corresponding to the driving input wirings 321 and 322, respectively. Since the driving input wirings 321 and 322 are likely to have different resistances relative to the driving input wirings 311 and 312, the magnitudes of their compensation resistors may be set to achieve $(R_{311}+R_{331})=(R_{312}+R_{332})=(R_{321}+R_{341})=(R_{322}+R_{342})$, where $R_{311}$ denotes the resistance magnitude of the driving input wiring 311, $R_{331}$ denotes the resistance magnitude of the input compensation resistor 331, $R_{312}$ denotes the resistance magnitude of the driving input wiring 312, $R_{332}$ denotes the resistance magnitude of the input compensation resistor 332, $R_{321}$ denotes the resistance magnitude of the driving input wiring 321, $R_{341}$ denotes the resistance magnitude of the input compensation resistor 341, $R_{322}$ denotes the resistance magnitude of the driving input wiring 322, and $R_{342}$ denotes the resistance magnitude of the input compensation resistor 342.

It is to be understood that, by setting the material, the line width and/or line thickness, etc of the input compensation resistors on the array substrate, the resistance magnitude thereof can be set in an adjustable manner, and the resistance magnitude of each input compensation resistor may be determined based on the measured resistance magnitude of the corresponding driving input wiring.

In a further alternative embodiment, one or more input compensation resistors may be arranged outside the array substrate, that is, the input compensation resistors are not limited to being arranged on the array substrate.

It is to be noted that, the clock driving signals CLK and CLKB are different clock signals with respect to the clock driving signals CLK' and CLKB', and the specific forms thereof are not restricted and various clock driving signals for block driving may be specifically employed.

Figure 5:
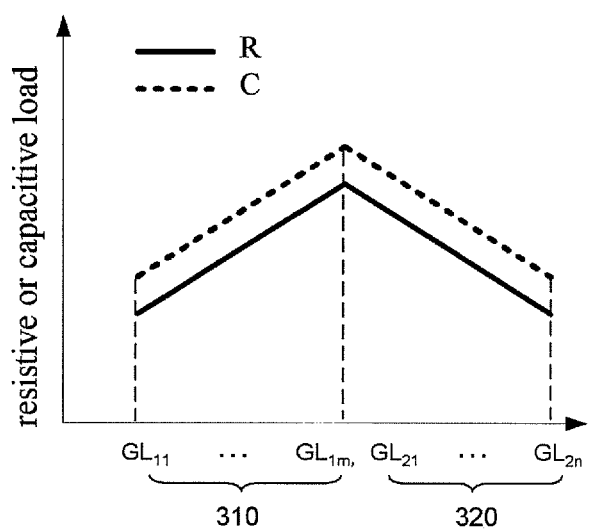
FIG. 5 is a schematic view showing variation tendencies of resistive loads and capacitive loads inputted by driving signals of respective shift registers in the shift register circuit of the embodiment shown in FIG. 3.

FIG. 5 is a schematic view showing variation tendencies of resistive loads and capacitive loads inputted by the driving signals of respective shift registers in the shift register circuit of the embodiment shown in FIG. 3. With reference to FIGS. 3 to 5, the abscissa represents the shift registers to which the gate lines $GL_{11}, GL_{12}, \ldots, GL_{1n}$ and the gate lines $GL_{21}, GL_{22}, \ldots, GL_{2n}$ of the shift register circuit 30 correspond, respectively, and the ordinate represents the resistive loads and the capacitive loads of the driving signals at above the shift registers. For each driver, the capacitive load C and the resistive load R are incrementally accumulated to the driving input wiring row by row in accordance with the direction along which the clock driving signal is inputted. Therefore, for each shift register of the driver 310, when the clock driving signals are inputted from the shift register $SR_{11}$ at the first end position thereof to the shift register $SR_{1n}$ at the second end position thereof successively, as the row number increases, the capacitive load C and the resistive load R are substantially linearly increased row by row, i.e. the capacitive loads C and the resistive loads R inputted by the driving signals of the shift registers $SR_{11}, SR_{12}, \ldots, SR_{1n}$ are gradually increased from $GL_{11}$ to $GL_{1n}$. For each shift register of the driver 320, when the clock driving signals are inputted from the shift register $SR_{2n}$ at the second end position thereof to the shift register $SR_{21}$ at the first end position thereof, as the row number increases, the capacitive load C and the resistive load R are substantially linearly decreased row by row, i.e. the capacitive loads C and the resistive loads R inputted by the driving signals of the shift registers $SR_{21}, SR_{22}, \ldots, SR_{2n}$ are gradually decreased from $GL_{21}$ to $GL_{2n}$ (the ratio of resistive loads/capacitive loads of the driving input wirings 321 and 322 to the capacitive loads C/resistive loads R inputted by the driving signals is relatively small).

In this way, at the boundary of the drivers 310 and 320, i.e. at the position corresponding to the gate lines $GL_{1n}$ and $GL_{21}$, the capacitive loads C and the resistive loads R inputted by the driving signals would not undergo a transition or the transition is greatly reduced, and RC delay of adjacent driving blocks at the boundary of blocks would not undergo a transition either or the transition is greatly reduced. The difference in delay between different blocks in the plane is decreased, which avoids the problem of generating blocks in display and thereby effectively reduces flickers, strips and mura.

Figure 6:
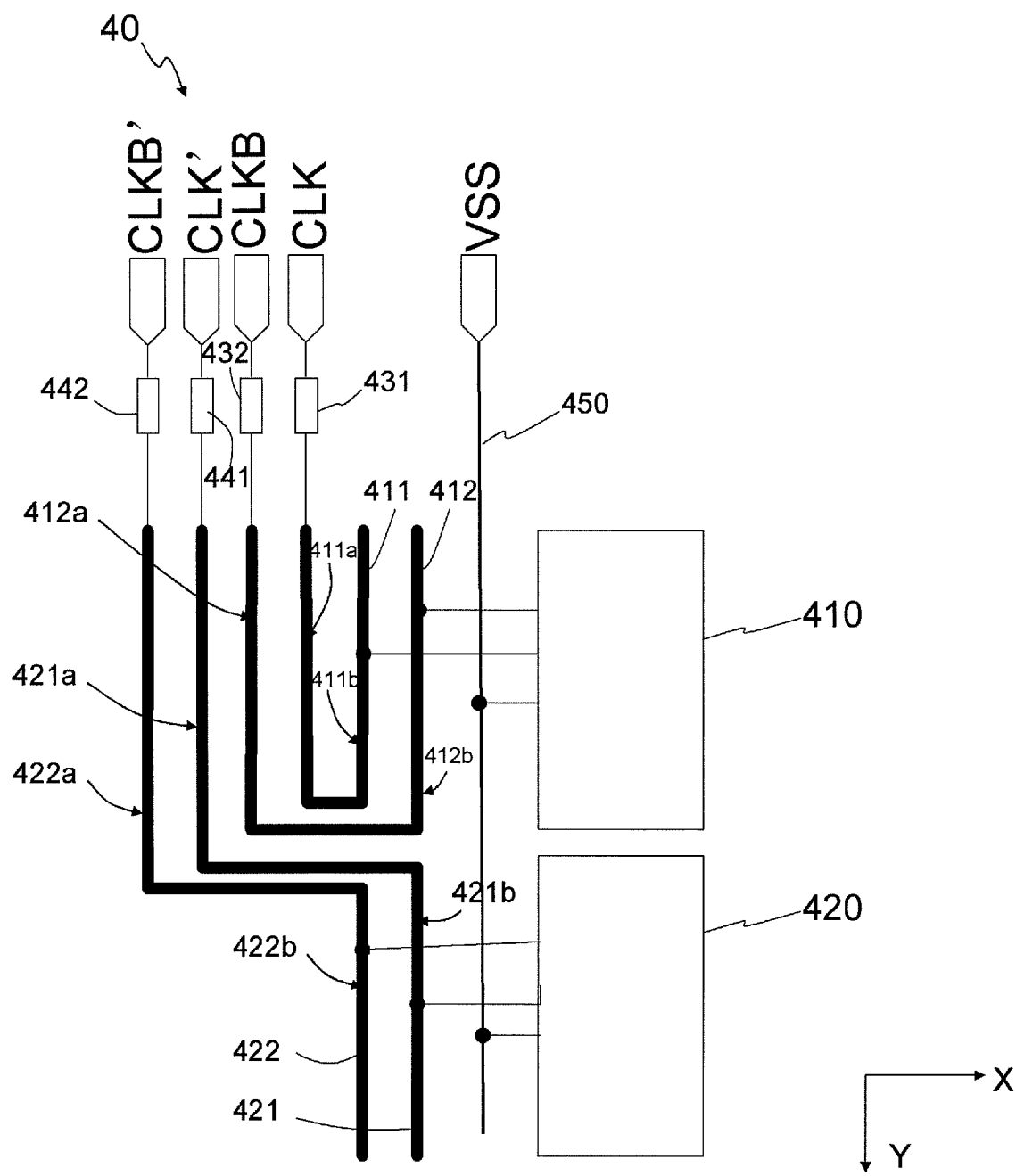
FIG. 6 is a simplified schematic view of a structure of a shift register circuit according to another embodiment of the present disclosure.

FIG. 6 shows a simplified schematic view of a structure of a shift register circuit according to another embodiment of the present disclosure. The shift register circuit 40 also employs block driving, which comprises a driver 410 and a driver 420. As compared to the shift register circuit 30 of the embodiment shown in FIG. 3, the driver 410 and the driver 420 are arranged in substantially the same manner as the driver 310 and the driver 320, respectively, for example, the first end positions and the second end positions thereof are also defined in the same way. Therefore, the driver 410 and the driver 420 are not described and illustrated in detail herein.

Referring to FIG. 6, driving input wirings 411 and 412 are arranged corresponding to the driver 410 for inputting clock driving signals CLK and CLKB to n shift registers SR of the driver 410, respectively. Driving input wirings 421 and 422 are arranged corresponding to the driver 420 for inputting clock driving signals CLK' and CLKB' to n shift registers SR of the driver 420, respectively. In this embodiment, the driving input wirings 411 and 412 are arranged to input the clock driving signals CLK and CLKB to individual shift registers from the shift register ($SR_{1n}$) at the second end position of the driver 410 to the shift register ($SR_{11}$) at the first end position of the driver 410 successively. The driving input wirings 421 and 422 are arranged to input clock driving signals CLK' and CLKB' to individual shift registers from the shift register ($SR_{21}$) of the first end position of the driver 420 to the shift register ($SR_{2n}$) at the second end position of the driver 420. That is, for the driver 410, the clock driving signals CLK and CLKB are successively inputted to the shift registers SR from the adjacent end to the distal end. For the driver 420, the clock driving signals CLK' and CLKB' are successively inputted to the shift registers SR from the adjacent end to the distal end.

Continuing to refer to FIG. 6, in an illustrative embodiment, a first segment 411a/412a of the driving input wiring 411/412 is first arranged in the Y direction from top to bottom, and a second segment 411b/412b thereof is arranged in the Y direction from bottom to top after it is reversely bent. That is, the driving input wiring 411/412 includes the first segment 411a/412a and the second segment 411b/412b arranged in the Y direction, and the second segment 411b/412b is reversely bent with respect to the first segment 411a/412a and connected thereto, and is arranged close to the driver 410. A first segment 421a/422a of the driving input wiring 421/422 is first arranged in the Y direction from top to bottom, and a second segment 421b/422b thereof is arranged in the Y direction from top to bottom after it is reversely bent. That is, the driving input wiring 421/422 includes the first segment 421a/422a and the second segment 421b/422b arranged in the Y direction, and the second segment 421b/422b is vertically bent with respect to the first segment 421a/422a and connected thereto, and is arranged close to the driver 420. The specific wiring shapes of the driving input wirings 411 and 412, 421 and 422 are not limited to this embodiment.

Continuing to refer to FIG. 6, optionally, an input compensation resistor may be arranged for each of the driving input wirings. In this embodiment, input compensation resistors 431 and 432 are arranged corresponding to the driving input wirings 411 and 412, respectively, and input compensation resistors 441 and 442 are arranged corresponding to the driving input wirings 421 and 422, respectively. Since the driving input wirings 411 and 412 are likely to have different resistances relative to the driving input wirings 421 and 422, the resistance magnitudes of their input compensation resistors may be set to achieve $(R_{411}+R_{431})=(R_{412}+R_{432})=(R_{421}+R_{441})=(R_{422}+R_{442})$, where $R_{411}$ denotes the resistance magnitude of the driving input wiring 411, $R_{431}$ denotes the resistance magnitude of the input compensation resistor 431, $R_{412}$ denotes the resistance magnitude of the driving input wiring 412, $R_{432}$ denotes the resistance magnitude of the input compensation resistor 432, $R_{421}$ denotes the resistance magnitude of the driving input wiring 421, $R_{441}$ denotes the resistance magnitude of the input compensation resistor 441, $R_{422}$ denotes the resistance magnitude of the driving input wiring 422, and $R_{442}$ denotes the resistance magnitude of the input compensation resistor 442.

Likewise, in a further alternative embodiment, one or more of the input compensation resistors 431 and 432 and the input compensation resistors 441 and 442 may be arranged outside the array substrate, that is, the input compensation resistors are not limited to being arranged on the array substrate.

Continuing to refer to FIG. 6, specifically, each of the shift registers SR in the drivers 410 and 420 is inputted with a voltage signal VSS via a driving input wiring 450.

Figure 7:
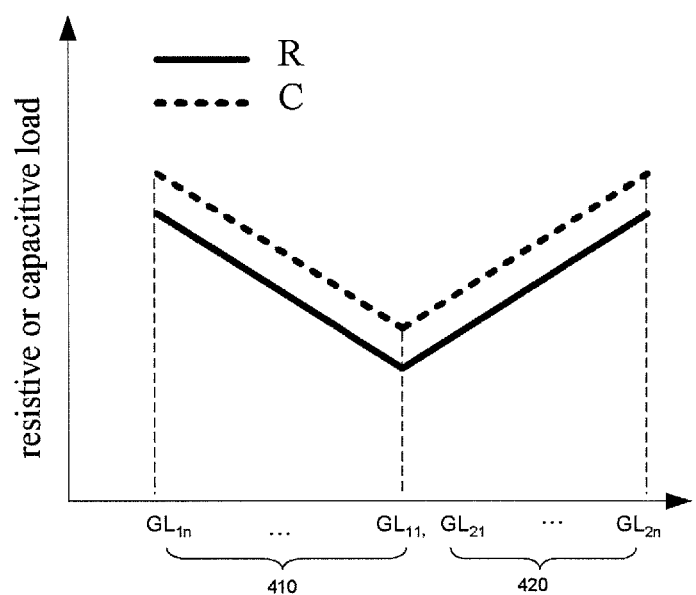
FIG. 7 is a schematic view showing variation tendencies of resistive loads and capacitive loads inputted by driving signals of respective shift registers in the shift register circuit of the embodiment shown in FIG. 6.

FIG. 7 is a schematic view showing variation tendencies of resistive loads and capacitive loads inputted by driving signals of respective shift registers in the shift register circuit of the embodiment shown in FIG. 6. The abscissa represents the shift registers to which the gate lines of the shift register circuit 40 correspond, and the ordinate represents the resistive loads and the capacitive loads corresponding to the driving signals at the above shift registers. Similarly, for each driver, the capacitive load C and the resistive load R thereof are incrementally accumulated to the driving input wiring row by row in accordance with the direction along which the clock driving signal is inputted. The direction along which the clock driving signal of the shift register circuit 40 is inputted is different from that along which the clock driving signal of the shift register circuit 30 of the embodiment shown in FIG. 3 is inputted. Therefore, for each shift register of the driver 410, when the clock driving signals are successively inputted from the shift register ($SR_{1n}$) at the second end position thereof to the shift register ($SR_{11}$) at the first end position thereof, as the row number increases, the capacitive load C and the resistive load R are substantially linearly decreased row by row synchronously, i.e. the capacitive loads C and the resistive loads R inputted by the driving signals of the shift registers $SR_{11}$, $SR_{12}, \ldots, SR_{1n}$ are gradually decreased from $GL_{11}$ to $GL_{1n}$ (the ratio of the resistive loads/capacitive loads of the driving input wirings 411 and 412 to the capacitive loads C/resistive loads R inputted by the driving signals is relatively small). For each shift register of the driver 420, when the clock driving signals are successively inputted from the shift register ($SR_{21}$) at the first end position thereof to the shift register ($SR_{2n}$) at the second end position thereof, as the row number increases, the capacitive load C and the resistive load R are substantially linearly increased row by row, i.e. the capacitive loads C and the resistive loads R inputted by the driving signals of the shift registers $SR_{21}$, $SR_{22}, \ldots, SR_{2n}$ are gradually increased synchronously from $GL_{21}$ to $GL_{2n}$.

In this way, at the boundary of the drivers 410 and 420, i.e. at the position corresponding to the gate lines $GL_{1n}$ and GL$_{21}$, the capacitive load C and the resistive load R would not undergo a transition or the transition is greatly reduced, and RC delay of adjacent driving blocks at the boundary of blocks would not undergo a transition either or the transition is greatly reduced.

Figure 8:
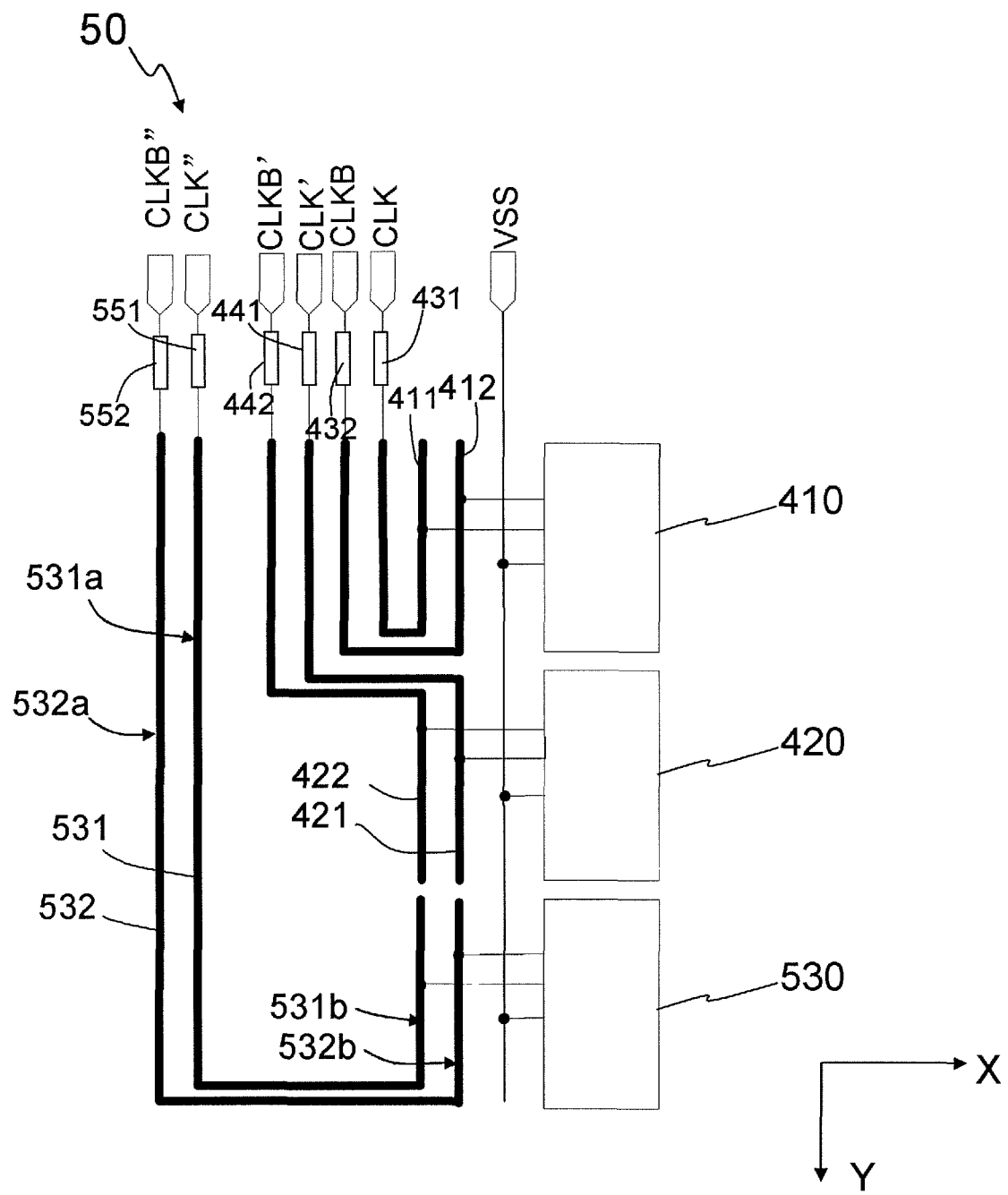
FIG. 8 is a simplified schematic view of a structure of a shift register circuit according to a further embodiment of the present disclosure.

FIG. 8 shows a simplified schematic view of a structure of a shift register circuit according to a further embodiment of the present disclosure. Referring to FIGS. 8 and 6, a shift register circuit 50 is obtained by extending the shift register circuit 40, wherein the shift register circuit 50 is added with one driver relative to the shift register circuit 40, i.e. driver 530. In the shift register circuit 50 and the shift register circuit 40, the same reference numerals denote the same components, which will not be described here one by one for simplicity.

Continuing to refer to FIG. 8, the driver 530 is arranged adjacent to the driver 420 in the Y direction. For example, it may include n shift registers (e.g. SR$_{31}$, SR$_{32}$, . . . , SR$_{3n}$) arranged from top to bottom, wherein the n shift registers are arranged in the same manner as the shift registers in the driver 420. Similarly, for the driver 530, a first end position and a second end position are also defined, that is, the input terminal position of the clock driving signal of the shift register SR$_{31}$ to which the gate line GL$_{31}$ of the driver 530 corresponds may be defined as the first end position, and the input terminal position of the clock driving signal of the shift register SR$_{3n}$ to which the gate line GL$_{3n}$ of the driver 530 corresponds may be defined as the second end position. The first end position of the driver 530 and the second end position of the driver 420 may also be defined as "adjacent ends" in terms of the relative position between adjacent drivers, and the positions away from the adjacent ends in the Y direction are defined as "distal ends". At that time, the second end position of the driver 420 is defined as an "adjacent end" and the first end position thereof is defined as a "distal end" with respect to the driver 530.

Driving input wirings 531 and 532 are arranged corresponding to the driver 530 for inputting clock driving signals CLK'' and CLKB'' to the n shift registers SR of the driver 530, respectively. In this embodiment, the driving input wirings 531 and 532 are arranged to input the clock driving signals CLK'' and CLKB'' to individual shift registers from the shift register (SR$_{3n}$) at the second end position of the driver 530 to the shift register (SR$_{31}$) at the first end position of the driver 530 successively, which reflects the direction along which the clock driving signals CLK'' and CLKB'' of the driver 530 are inputted.

Continuing to refer to FIG. 8, in an illustrative embodiment, a first segment 531a/532a of the driving input wiring 531/532 is first arranged in the Y direction from top to bottom, and a second segment 531b/532b thereof is arranged in the Y direction from bottom to top after it is reversely bent. That is, the driving input wiring 531/532 includes the first segment 531a/532a and the second segment 531b/532b arranged in the Y direction, and the second segment 531b/532b is reversely bent with respect to the first segment 531a/532a and connected thereto, and is arranged close to the driver 530.

Continuing to refer to FIG. 8, optionally, an input compensation resistor may be arranged for each of the driving input wirings. In this embodiment, input compensation resistors 551 and 552 are arranged corresponding to the driving input wirings 531 and 532, respectively. Since the driving input wirings 411 and 412, the driving input wirings 421 and 422, and the driving input wirings 531 and 532 are likely to have mutually different resistances, the resistance magnitudes of their input compensation resistors may be set to achieve (R$_{41}$+R$_{431}$)=(R$_{412}$+R$_{432}$)=(R$_{421}$+R$_{441}$)=(R$_{422}$+R$_{442}$)=(R$_{531}$+R$_{551}$)=(R$_{532}$+R$_{552}$), where R$_{411}$ denotes the resistance magnitude of the driving input wiring 411, R$_{431}$ denotes the resistance magnitude of the input compensation resistor 431, R$_{412}$ denotes the resistance magnitude of the driving input wiring 412, R$_{432}$ denotes the resistance magnitude of the input compensation resistor 432, R$_{421}$ denotes the resistance magnitude of the driving input wiring 421, R$_{441}$ denotes the resistance magnitude of the input compensation resistor 441, R$_{422}$ denotes the resistance magnitude of the driving input wiring 422, R$_{442}$ denotes the resistance magnitude of the input compensation resistor 442, R$_{531}$ denotes the resistance magnitude of the driving input wiring 531, R$_{551}$ denotes the resistance magnitude of the input compensation resistor 551, R$_{532}$ denotes the resistance magnitude of the driving input wiring 532, and R$_{552}$ denotes the resistance magnitude of the input compensation resistor 552.

Figure 9:
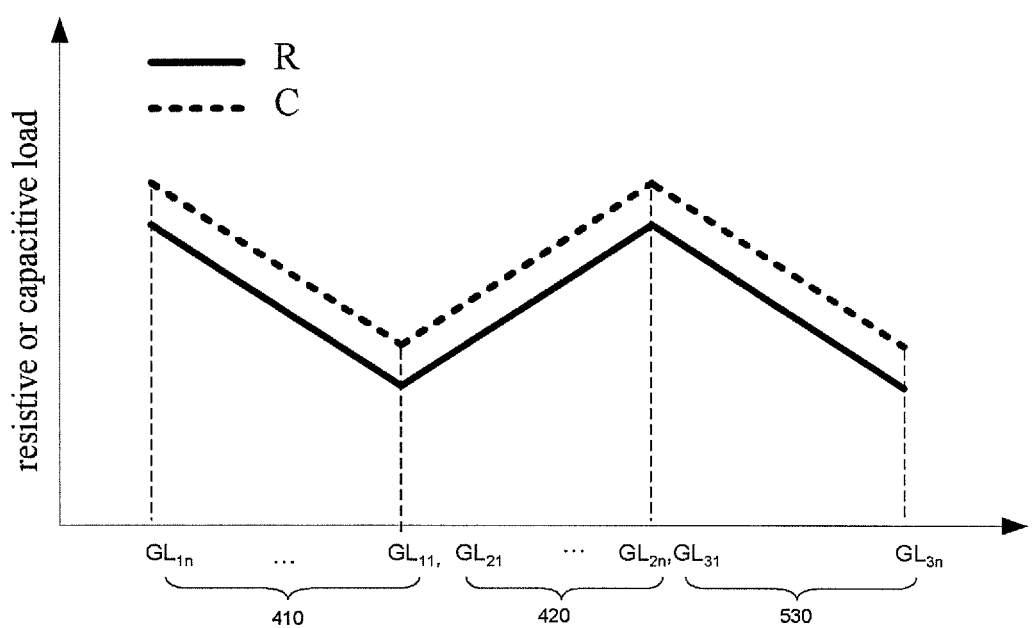
FIG. 9 is a schematic view showing variation tendencies of resistive loads and capacitive loads inputted by driving signals of respective shift registers in the shift register circuit of the embodiment shown in FIG. 8.

FIG. 9 is a schematic view showing variation tendencies of resistive loads and capacitive loads inputted by the driving signals of respective shift registers in the shift register circuit of the embodiment shown in FIG. 8. The abscissa represents the shift registers to which the gate lines of the shift register circuit 50 correspond, respectively, and the ordinate represents the resistive loads and the capacitive loads corresponding to the driving signals at the above shift registers. Similarly, for each driver, the capacitive load C and the resistive load R are incrementally accumulated to the driving input wiring row by row in accordance with the direction along which the clock driving signals are inputted.

As shown in FIG. 9, the variation tendencies of the capacitive loads C and the resistive loads R of the driver 410 and the driver 420 may also refer to FIG. 7. At the boundary of the drivers 410 and 420, i.e. at the position corresponding to the gate lines GL$_{1n}$ and GL$_{21}$, the capacitive load C and the resistive load R would not undergo a transition or the transition is greatly reduced, and RC delay of adjacent driving blocks at the boundary of blocks would not undergo a transition either or the transition is greatly reduced. For each shift register of the driver 530, when the clock driving signals are successively inputted from the shift register (SR$_{3n}$) at the second end position thereof to the shift register (SR$_{31}$) at the first end position thereof, as the row number increases, the capacitive load C and the resistive load R are substantially linearly decreased row by row synchronously, i.e. the capacitive loads C and the resistive loads R inputted by the driving signals of the shift registers SR$_{31}$, SR$_{12}$, . . . , SR$_{3n}$ are gradually decreased from GL$_{31}$ to CL$_{3n}$. At the boundary of the drivers 420 and 530, i.e. the position corresponding to the gate lines GL$_{2n}$ and GL$_{31}$, the capacitive load C and the resistive load R would not undergo a transition or the transition is greatly reduced, and RC delay of adjacent driving blocks at the boundary of blocks would not undergo a transition either or the transition is greatly reduced.

On the basis of the teachings of the foregoing embodiments, at the time of performing block driving for more than three drivers, one can arrange a driving input wiring for each driver in an extendable manner so that the input directions of any two adjacent drivers are reversely arranged (reverse in the Y direction), such that RC delay at the boundary of any two adjacent drivers would not undergo a transition or the transition is greatly reduced, which avoids the problem of generating blocks in display and is advantageous to reducing flickers, stripes and mura.

Further, the shift register circuit 30, 40 or 50 according to the foregoing embodiments may be formed on an array substrate to form the array substrate according to embodiments of the present disclosure. Based on such a array substrate, a corresponding display device may be manufactured. The display effect of the display device will be greatly improved.

It is to be understood that the first end position and the second end position of the driver are defined relative to each other in order to clarify the input directions of the clock driving signals of adjacent drivers, and are not limited to the foregoing embodiments. In other embodiments, the first end position may also correspond to the maximum permutation ordinal number of the gate lines to which the driver corresponds on the array substrate, and the second end position may also correspond to the minimum permutation ordinal number of the gate lines to which the driver corresponds on the array substrate. For example, the input terminal position of the clock driving signal of the shift register $SR_{21}$ to which the gate line $GL_{21}$ of the driver 320 corresponds may be defined as the second end position, and the input terminal position of the clock driving signal of the shift register $SR_{1n}$ to which the gate line $GL_{1n}$ of the driver 310 corresponds may be defined as the first end position.

It is to be further understood that, although the drawings schematically show that each of the drivers has the same number of shift registers, those skilled in the art can divide drivers based on actual needs and design the number of shift registers included in each of the drivers.

The above examples mainly illustrate the shift register circuit of the present disclosure. While only some of the embodiments of the present disclosure have been described, it should be understood by those ordinarily skilled in the art that the present disclosure may be carried in many other forms without departing from the gist and scope thereof. Accordingly, the illustrated examples and embodiments are to be regarded as illustrative rather than restrictive, and the present disclosure may cover various modifications and substitutions without departing from the spirit and scope of the present disclosure as defined in the appended claims.

The invention claimed is:

1. A shift register circuit comprising:
two or more drivers arranged on an array substrate in a direction substantially perpendicular to a gate line, each driver comprising one or more shift registers, wherein any two of the drivers adjacent to each other are defined as a first driver and a second driver, respectively;
wherein a first driving input wiring of the first driver is arranged to input a first clock driving signal to individual shift registers successively from a shift register at a first end position of the first driver to a shift register at a second end position of the first driver, a second driving input wiring of the second driver is arranged to input a second clock driving signal to individual shift registers successively from a shift register at a second end position of the second driver to a shift register at a first end position of the second driver; and
wherein in each of the drivers the second end position is opposite to the first end position in the direction substantially perpendicular to the gate line.

2. The shift register circuit according to claim 1, further comprising a first input compensation resistor arranged corresponding to the first driving input wiring and a second input compensation resistor arranged corresponding to the second driving input wiring,
wherein a sum of resistances of the first driving input wiring and the first input compensation resistor is equal to a sum of resistances of the second driving input wiring and the second input compensation resistor.

3. The shift register circuit according to claim 2, wherein at least one of the first input compensation resistor and the second input compensation resistor are arranged on the array substrate and/or outside the array substrate.

4. The shift register circuit according to claim 2, wherein at least one of the first input compensation resistor and the second input compensation resistor are arranged outside the array substrate.

5. The shift register circuit according to claim 1, wherein the first end position corresponds to a minimum permutation ordinal number of gate lines to which the first driver or the second driver corresponds on the array substrate, and the second end position corresponds to a maximum permutation ordinal number of gate lines to which the first driver or the second driver corresponds on the array substrate.

6. The shift register circuit according to claim 5, wherein the first driving input wiring is arranged close to the first driver in the direction substantially perpendicular to the gate line; and
the second driving input wiring comprises a first segment arranged in the direction substantially perpendicular to the gate line and a second segment which is reversely bent with respect to the first segment and connected to the first segment, the second segment being arranged closer to the second driver than the first segment.

7. The shift register circuit according to claim 5, wherein the first driving input wiring comprises a first segment arranged in the direction substantially perpendicular to the gate line and a second segment which is vertically bent with respect to the first segment and connected to the first segment; and
the second driving input wiring comprises a first segment arranged in the direction substantially perpendicular to the gate line and a second segment which is reversely bent with respect to the first segment and connected to the first segment, the second segment being arranged closer to the second driver than the first segment.

8. The shift register circuit according to claim 7, wherein the second segment of the first driving input wiring is arranged closer to the first driver than the first segment of the first driving input wiring.

9. The shift register circuit according to claim 1, wherein the first end position corresponds to a maximum permutation ordinal number of gate lines to which the first driver or the second driver corresponds on the array substrate, and the second end position corresponds to a minimum permutation ordinal number of gate lines to which the first driver or the second driver corresponds on the array substrate.

10. The shift register circuit according to claim 9, wherein the first driving input wiring comprises a first segment arranged in the direction substantially perpendicular to the gate line and a second segment which is reversely bent with respect to the first segment and connected to the first segment, the second segment of the first driving input wiring being arranged closer to the first driver than the first segment; and
the second driving input wiring comprises a first segment arranged in the direction substantially perpendicular to the gate line and a second segment which is vertically bent with respect to the first segment and connected to the first segment.

11. The shift register circuit according to claim 10, wherein the second segment of the second driving input wiring is arranged closer to the second driver than the first segment of the second driving input wiring.

12. The shift register circuit according to claim 1, wherein the first driving input wiring and the second driving input wiring input the first clock driving signal and the second clock driving signal respectively at a same position of the array substrate.

13. The shift register circuit according to claim 1, wherein the first driving input wiring and the second driving input wiring have a substantially same line width.

14. The shift register circuit according to claim 1, wherein each of the drivers includes a same number of shift registers.

15. An array substrate comprising the shift register circuit according to claim 1.

16. A display device comprising the array substrate according to claim 15.

17. The array substrate according to claim 15, wherein the shift register circuit further comprising a first input compensation resistor arranged corresponding to the first driving input wiring and a second input compensation resistor arranged corresponding to the second driving input wiring,
   wherein a sum of resistances of the first driving input wiring and the first input compensation resistor is equal to a sum of resistances of the second driving input wiring and the second input compensation resistor.

18. The array substrate according to claim 17, wherein at least one of the first input compensation resistor and the second input compensation resistor are arranged on the array substrate.

19. The array substrate according to claim 17, wherein at least one of the first input compensation resistor and the second input compensation resistor are arranged outside the array substrate.

20. The shift register circuit according to claim 1, wherein the first driving input wiring and the second driving input wiring have a substantially same line thickness.

* * * * *